(12) United States Patent
Seko et al.

(10) Patent No.: US 7,812,364 B2
(45) Date of Patent: Oct. 12, 2010

(54) SEMICONDUCTOR LIGHT EMITTING DEVICE

(75) Inventors: Masahiro Seko, Kitakatsuragi-Gun (JP); Hisayuki Shinohara, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/053,356

(22) Filed: Mar. 21, 2008

(65) Prior Publication Data

US 2008/0230790 A1    Sep. 25, 2008

(30) Foreign Application Priority Data

Mar. 23, 2007    (JP)    ............... 2007-077348

(51) Int. Cl.
*H01L 33/00*    (2010.01)
(52) U.S. Cl. ............... 257/99; 257/89; 257/666; 257/672; 257/678; 257/734; 257/787; 257/E33.001
(58) Field of Classification Search ............... 257/89, 257/E33.001, 666, 672, 678, 734, 787, 99
See application file for complete search history.

(56) References Cited

U.S. PATENT DOCUMENTS 6,486,543 B1    11/2002    Sano et al.
2005/0168922 A1    8/2005    Tay et al.
2006/0102917 A1 *    5/2006    Oyama et al. ............... 257/99
2007/0247841 A1 *    10/2007    Kono et al. ............... 362/227
2009/0194782 A1    8/2009    Hata et al.

FOREIGN PATENT DOCUMENTS

| JP | 11-330131 | 11/1999 |
|----|-----------|---------|
| JP | 2000-40781 | 2/2000 |
| JP | 2004-71675 A | 3/2004 |
| JP | 2006-024794 | 1/2006 |
| JP | 2006-222382 A | 8/2006 |

\* cited by examiner

*Primary Examiner*—Cuong Q Nguyen
*Assistant Examiner*—Trang Q Tran
(74) *Attorney, Agent, or Firm*—Morrison & Foerster LLP

(57) ABSTRACT

A semiconductor light emitting device has an outer lead disposed along an outer wall of a mold resin portion perpendicular to a light-emitting plane of a light emitting diode. An outer lead is also disposed at an outer wall of the mold resin portion parallel to and opposite to the light-emitting plane. The outer wall of the resin mold where the outer lead is disposed is taken as a mount face. Each outer wall of the mold resin portion constituting a mount face includes at least one outer lead for an anode and a cathode. According to the present configuration, there is provided a semiconductor light emitting device that allows selection of side-emission mounting or top-emission mounting with the same components on a mount substrate.

17 Claims, 7 Drawing Sheets

SEMICONDUCTOR LIGHT EMITTING DEVICE

This nonprovisional application is based on Japanese Patent Application No. 2007-077348 filed with the Japan Patent Office on Mar. 23, 2007, the entire contents of which are hereby incorporated by reference.

BACKGROUND OF THE INVENTION

1. Field of the Invention

The present invention relates to a semiconductor light emitting device employing a light emitting diode and the like.

2. Description of the Background Art

A surface-mount type semiconductor light emitting device employing a light emitting diode (hereinafter, referred to as "LED") has a configuration as represented in FIGS. 12-14. FIGS. 12, 13 and 14 are a front view, a bottom view, and a side view, respectively, of a conventional surface-mount type semiconductor light emitting device. The conventional surface-mount type semiconductor light emitting device has a resin portion 102 provided by insert-molding or the like in a manner fastening a lead frame 101. On lead frame 101, an LED chip 103 is electrically and mechanically connected by silver (Ag) paste 104 and gold wire 105. LED chip 103 is surrounded by epoxy resin 106 to be protected and encapsulated.

Lead frame 101 is formed in a specified pattern shape, and insert-molded in resin 102 in a bonded state or a state plated with silver. LED chip 103 is electrically and mechanically connected on lead frame 101 by silver paste 104 and gold wire 105, followed by encapsulation with epoxy resin 106. Then, the lead has the unnecessary region cut and is bent in an inverted block upper case C shape. Thus, a terminal portion 107 for coupling with a mounting board including electric circuitry such as a driving circuit is formed. The conventional device shown in FIG. 12 has a light-emitting face 108 parallel to the mount face, and is qualified as a top emission type surface-mount LED light emitting element.

As prior art documents disclosing a conventional surface-mount LED light emitting element set forth above, Japanese Patent Laying-Open Nos. 2004-071675 and 2006-222382 can be cited.

In the packaging process of the convention surface-mount LED light emitting element set forth above on a mounting board that includes electrical circuitry such as a driving device, selection of a top emission type for mounting parallel to the light-emitting plane, or a side emission type for mounting perpendicular to the light-emitting plane depends upon the arrangement of the terminal portion of the LED light emitting element. Therefore, there was no option in mounting on a substrate between a side emission type or a top emission type with the same components.

SUMMARY OF THE INVENTION

In view of the foregoing, an object of the present invention is to provide a semiconductor light emitting device that allows selection of either a side emission type or top emission type for mounting on a substrate, based on the same components, corresponding to the status or the like of an irradiation subject.

A semiconductor light emitting device of the present invention directed to solving the above problem includes a semiconductor light emitting element, a lead frame including a plurality of inner leads having a placement face where the semiconductor light emitting element is mounted and an extraction electrode, and a plurality of outer leads for electrodes, and a mold resin portion to fasten the lead frame. Each of the outer leads is disposed along a first outer wall face of the mold resin portion perpendicular to a light-emitting plane of the semiconductor light emitting element, and along a second outer wall face of the mold resin portion parallel to and opposite to the light-emitting plane. Each of the first and second outer wall faces constitutes a mount face and includes at least one outer lead for each of an anode and cathode electrically connected to an anode electrode and a cathode electrode of a semiconductor light emitting element.

Each outer lead is disposed over the first and second outer wall faces, and all pairs of an anode terminal and a cathode terminal electrically connected to the anode and cathode of each semiconductor light emitting element are arranged at each of the first and second outer wall faces.

Each of the outer leads is preferably disposed over the first and second outer wall faces, and a plurality of outer leads, respectively linked with inner leads arranged in the direction of the width of the outer leads, are facing each other on the first and second outer wall faces. In addition, the surface of the outer lead is preferably parallel to and flat on the face of the wall of the mold resin portion.

In a preferable embodiment of the present invention, the outer lead includes eight terminals, among which four terminals are disposed for shared usage at the first and second outer wall faces. One pair of two terminals among the remaining four terminals is disposed at the first outer wall face and the other pair of two terminals is disposed at the second outer wall face. According to this structure, the first outer wall face is to be used as a mount face for the side-emission mounting mode and the second outer wall face is to be used as a mount face for the top-emission mounting mode.

In addition, a common lead can be split into two terminals in the lead frame, one that is formed for a side-emission terminal and the other formed for a top-emission terminal. Furthermore, a plurality of semiconductor light emitting elements are mounted. The anode and cathode of each of the plurality of semiconductor light emitting elements may have an outer lead terminal, allowing independent driving and independent current adjustment of the plurality of semiconductor light emitting elements.

In addition, the semiconductor light emitting element may be formed of a chip of one of the three primary colors (red, green, blue), allowing current adjustment of each chip. Further, the outer lead may be configured corresponding to a body of poor solder wettability such as Cu plated with metal of favorable solder wettability such as Sn, Au or Ag.

The mold resin portion fastening the lead frame may be configured to cover a portion of the surface of the inner lead at an opening face of the light-emitting plane side. In contrast, the mold resin portion fastening the lead frame may be configured to avoid covering the surface of the inner lead at the opening face at the light-emitting plane side.

Thus, side-emission type mounting or top-emission type mounting can be selected with the same component. The availability of a semiconductor light emitting device is rendered extensive with one component.

The foregoing and other objects, features, aspects and advantages of the present invention will become more appar-

DESCRIPTION OF THE PREFERRED EMBODIMENTS

First Embodiment

Figure 1:
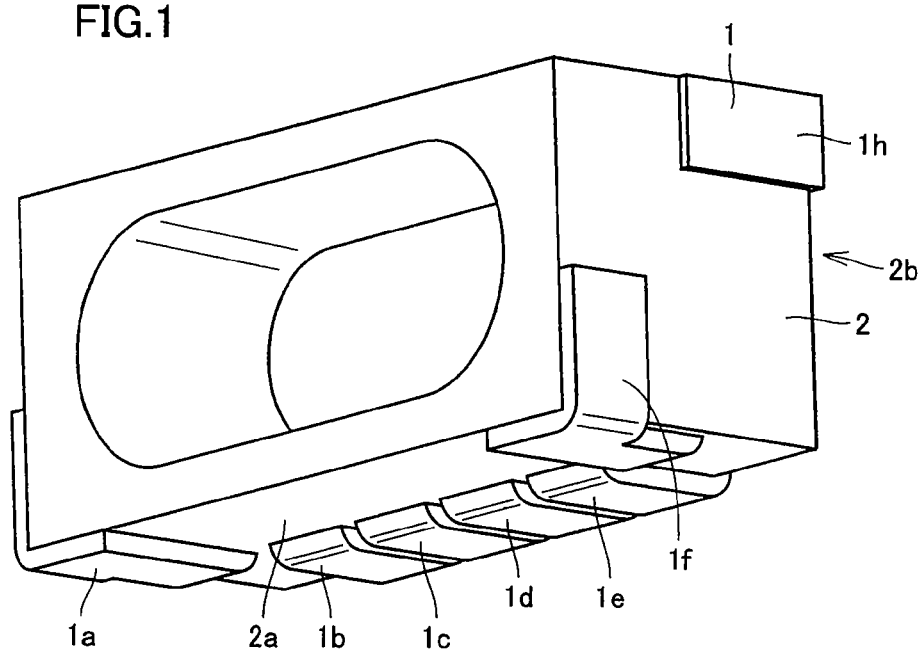
FIG. 1 is a schematic perspective view of a semiconductor light emitting device according to a first embodiment of the present invention.
Figure 2:
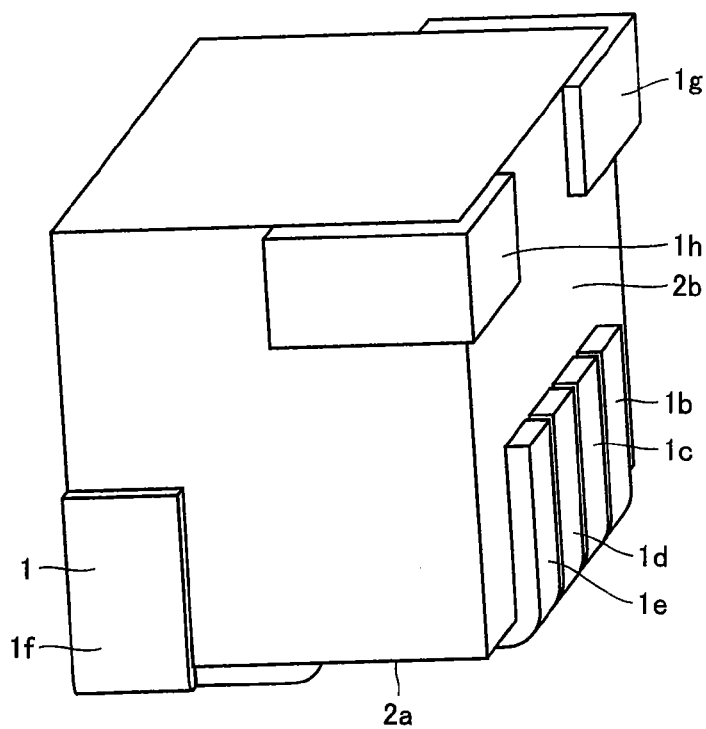
FIG. 2 is a perspective view of the semiconductor light emitting device according to the first embodiment of the present invention, viewed from another direction.
Figure 3:
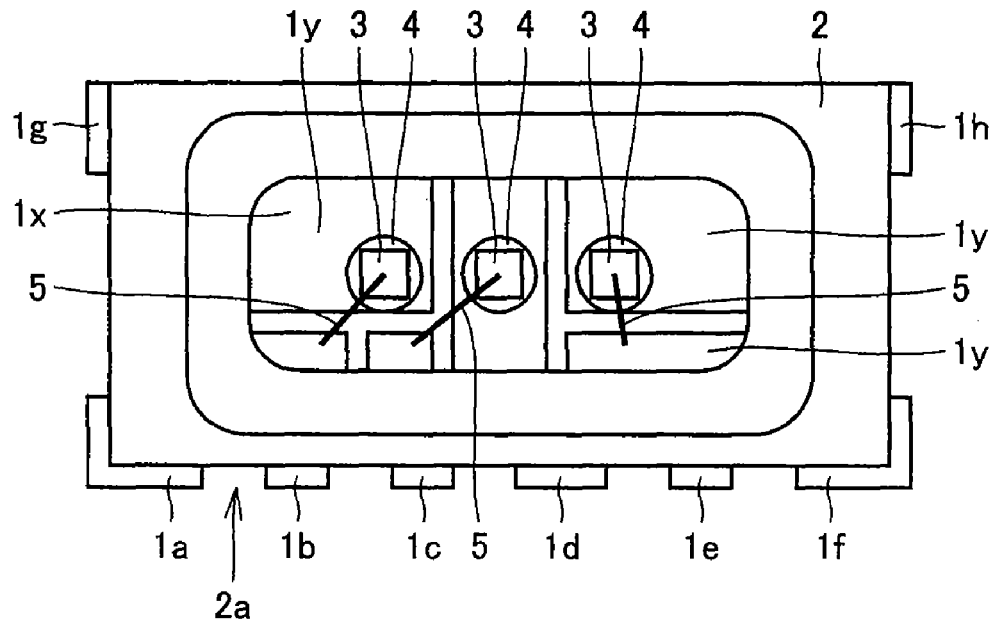
FIGS. 3, 4, 5, 6, 7, and 8 are a front view, plan view, bottom view, side view, a back view, and a sectional view, respectively, of the semiconductor light emitting device according to the first embodiment of the present invention.
Figure 4:
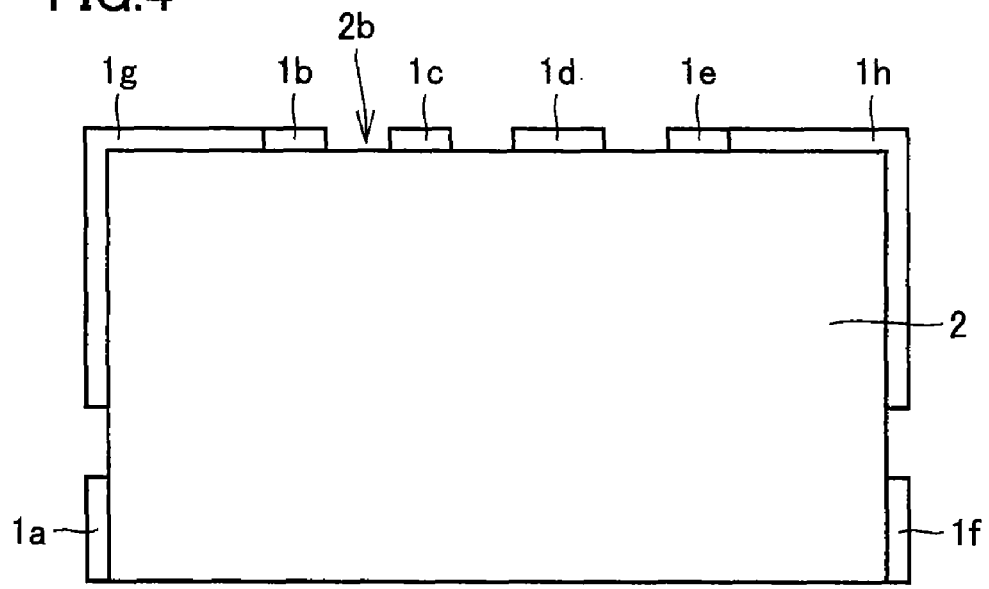
Figure 5:
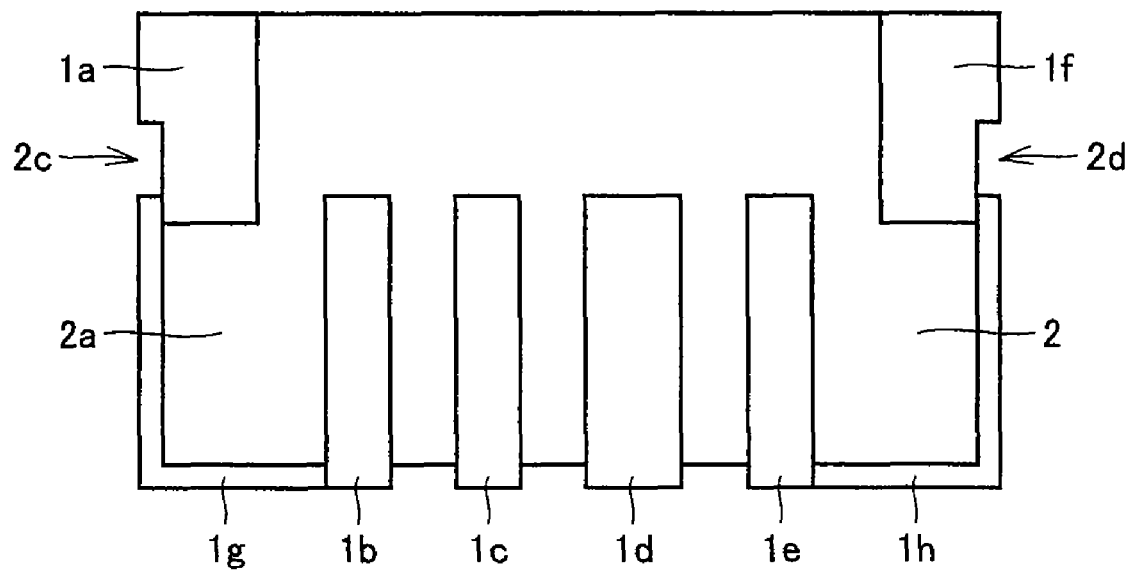
Figure 6:
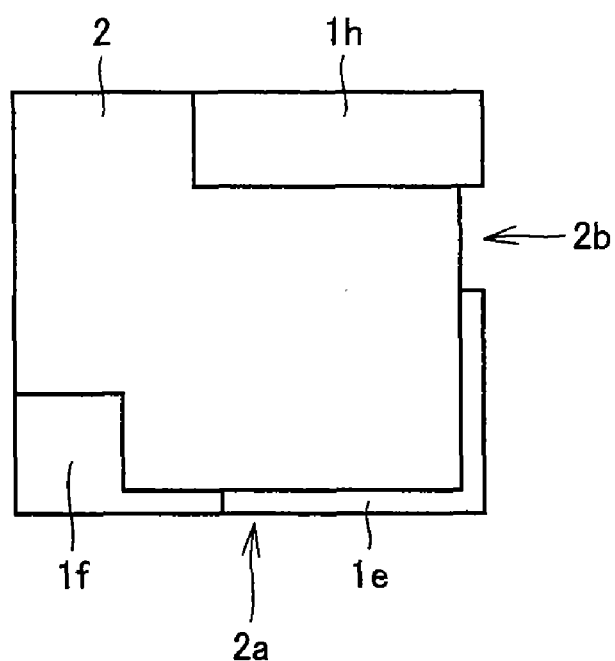
Figure 7:
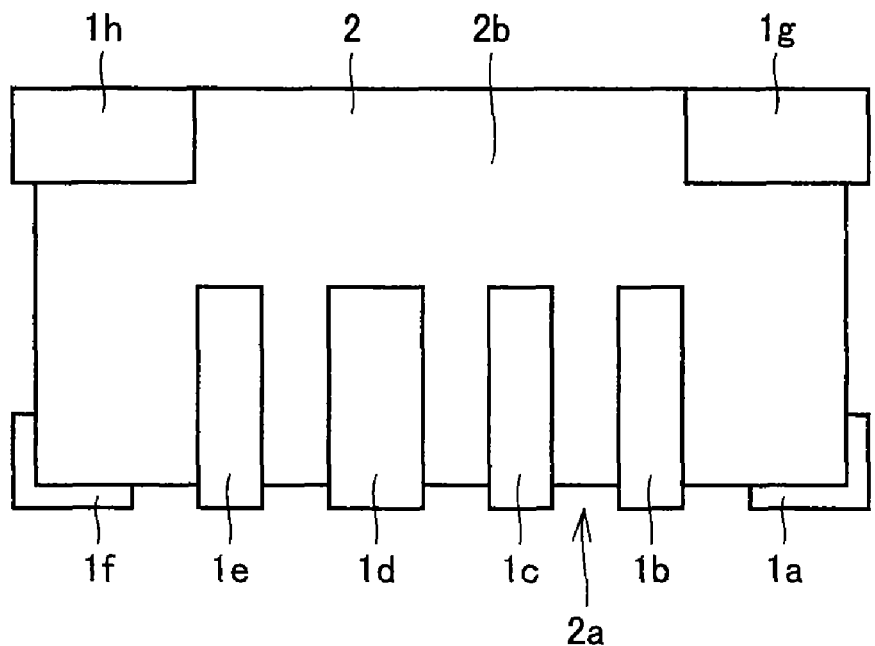
Figure 8:
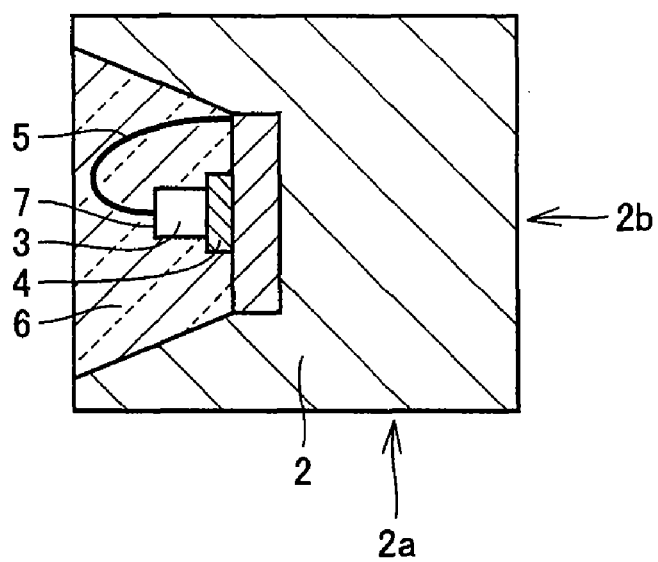

A first embodiment of the present invention will be described hereinafter with reference to FIGS. 1-8. The first embodiment is directed to a surface-mount semiconductor light emitting device employing an LED as the light emitting element. FIGS. 1 and 2 are perspective views of the surface-mount semiconductor light emitting device, viewed from different directions. Referring to FIG. 1 or 2, a lead frame including terminals 1a, 1b, 1c, 1d, 1e, 1f, 1g and 1h qualified as outer leads are insert-molded and protected in a mold resin portion 2 formed of a well known sealing material for a semiconductor element such as polyphthalamide (PPA), polycarbonate resin, epoxy resin, and the like. An LED 3 is mounted on lead frame 1. This LED 3 is connected mechanically and electrically to lead frame 1 by silver paste 4 and gold wire 5. For the purpose of holding and fixing lead frame 1, there is provided mold resin portion 2 formed of white resin, surrounding a placement face 1x of LED 3, filling the gap in the lead frame at placement face 1x, and covering the entire bottom face.

In addition, LED 3 is surrounded by encapsulation resin 6 to be sealed and protected. Encapsulation resin 6 is transparent or opalescent having a diffusing agent mixed, formed of epoxy resin or silicone resin, casted mainly by the potting method. Transfer formation, injection formation, or the like is also allowed. The light-emitting plane 7 that is the front region from which light is emitted from LED 3 can be formed in an arbitrary shape such as a lens.

In lead frame 1, a common lead is split into two terminals. One of these terminals is formed for a side-emission terminal. Terminals 1g and 1a, and also terminals 1h and 1f correspond to the same electrode, split into two inside. The layout is established to allow usage as a mount face 2a for side-emission and a mount face 2b for top-emission.

The configuration of the semiconductor light emitting device of the present embodiment will be described in further detail based on FIGS. 3-8 hereinafter. Lead frame 1 is formed integrally with resin mold portion 2 directed to holding, protecting, and fastening lead frame 1. Lead frame 1 includes a plurality of inner leads 1y having a placement face 1x where LED 3 is to be mounted, and terminals 1a, 1b, 1c, 1d, 1e, 1f, 1g and 1h qualified as a plurality of outer leads for electrodes. Among the outer lead terminals, terminals 1a, 1b, 1c, 1d, 1e and 1f are disposed along side-emission mount face 2a that is the outer wall of resin mold portion 2 perpendicular to light-emitting plane 7 where the light emitting region of LED 3 is located. Terminals 1b, 1c, 1d, 1e, 1g and 1h are disposed at top-emission mount face 2b that is the outer wall of resin mold portion 2 parallel to and opposite to light emitting plane 7. Terminals 1a, 1g and terminals 1h, 1f of the outer leads constitute terminal pairs, extending and split from a closest-located inner lead with a placement face, qualified as terminal pairs for a cathode. Terminals 1b, 1e and 1c are terminals for an anode, each extending from the closest-located inner lead directed to wire leading. The inner lead located at the middle of the placement face extends, corresponding to a cathode terminal leading to terminal 1d. Specifically, at mount face 2a and mount face 2b, the anode terminal and cathode terminal corresponding to the anode electrode and cathode electrode of each LED 3 are arranged, one pair each. A complicated mounting structure is avoided no matter which mount face is selected. Mounting on a flat substrate is allowed with one surface.

Outer lead terminals 1b, 1c, 1d, 1e and terminals 1a, 1f, and also terminals 1b, 1c, 1d, 1e and terminals 1g, 1h are arranged opposite to each other respectively at mount faces 2a and 2b. The surface of each terminal is parallel to and flat on the face of the outer wall of mold resin portion 2. Therefore, an unstable fixed state such as inclination is eliminated regardless of which of mount faces 2a and 2b is employed.

In the present embodiment, three LEDs 3 are placed. The anode and cathode of each LED 3 include terminals 1a and 1g and terminals 1f and 1h of the outer lead electrically connected, allowing independent driving and current adjustment of LED 3 (not shown), constituting the LED configuration for the three primary colors (red, green and blue). The reason why eight terminals are provided in the present embodiment is to allow the mounting of three chips at most in order to realize full color display by incorporating the three primary colors and controlling respective current independently. Four among the eight terminals are shared for side-emission and top-emission, and one pair of the remaining four terminals is used exclusively for side-emission, and the second pair of the remaining four terminals is used exclusively for top-emission. Thus, shared usage for side-emission and top-emission is allowed.

Each outer lead terminal is advantageously formed by having a body of poor solder wettability plated with metal of favorable solder wettability. Cu is employed for the body. Sn, Au, Ag, or SnBi is employed for the metal plating. For the purpose of mounting on a flat printed board where the interconnection pattern is formed without inclination, each terminal is formed to a thickness such that the surface of each terminal disposed at the outer wall qualified as the mount face of mold resin is parallel to and flush with the outer wall.

The outer lead linking to inner lead 1y where light emitting diode 3 is mounted in the present embodiment is set to have an area larger than the area of other leads where light emitting diode 3 is not mounted. By increasing the volume of the lead where LED 3 is mounted as much as possible, heat generated at the time of light emission by LED 3 to cause increase in temperature can be dispersed efficiently. Degradation such as discoloring caused by the heat of the entire device package where LED 3 is incorporated can be prevented. Furthermore, by rendering the lead where LED 3 is mounted thick, identification of which of the plurality of leads an LED 3 is mounted can be readily made. Leads 1*a*, 1*g*, 1*f*, 1*h* and 1*d* shown in FIG. 5 or 7 correspond to the terminals (outer lead) made larger than outer leads 1*b*, 1*c*, and 1*e* linking to an inner lead where LED 3 is not mounted.

Furthermore, the lead may be formed integrally using ceramic instead of encapsulation resin 6. By using ceramic, heat dissipation of the light emitting element can be improved.

Second Embodiment

Figure 9:
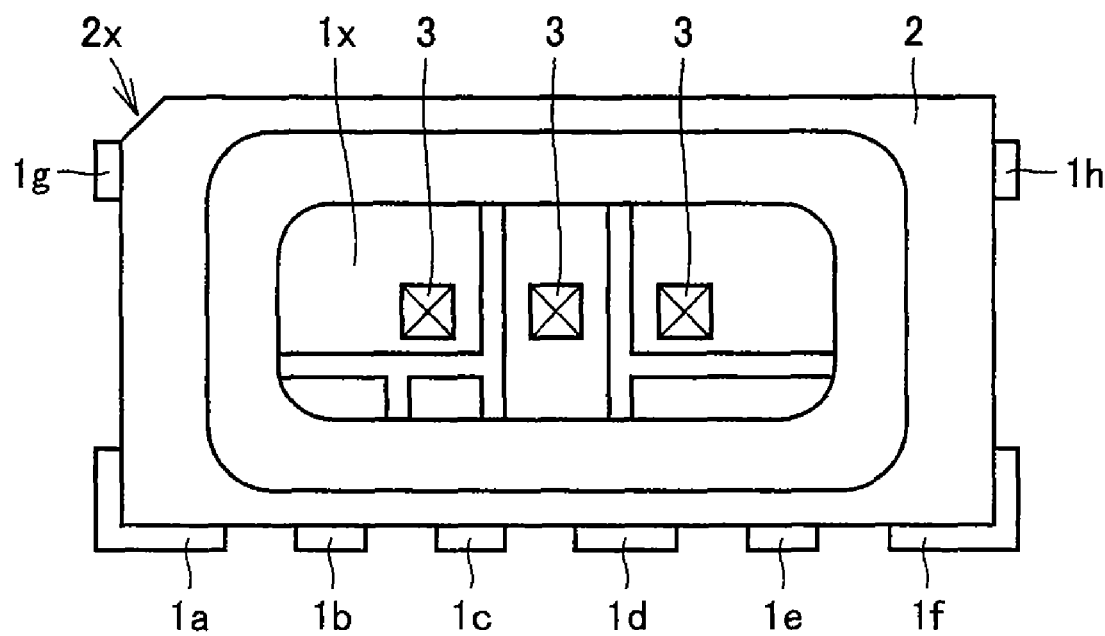
FIG. 9 is a front view of a semiconductor light emitting device according to a second embodiment of the present invention.

A second embodiment of the present invention will be described hereinafter with reference to FIG. 9. In the present embodiment, a corner of resin mold portion 2 at the light-emitting plane side, parallel to placement face 1*x* where LED 3 is mounted, or a corner of the face perpendicular to placement face 1*x*, is formed as a chamfered face 2*x* that differs in configuration from the other corner. By employing a chamfered face 2*x* for one corner in the present embodiment taking a different configuration, the directivity of the package of the LED semiconductor light emitting device qualified as a product can be indicated. This facilitates identification of the direction of the LED light emitting element by means of an outer shape recognition device or the like.

Third Embodiment

Figure 10:
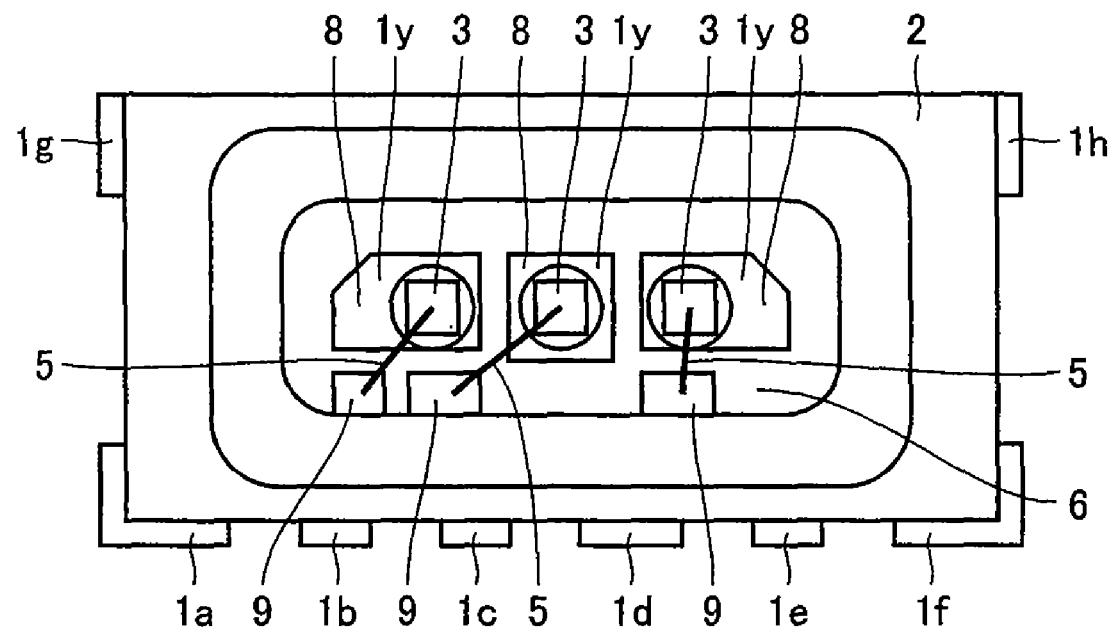
FIG. 10 is a front view of a semiconductor light emitting device according to a third embodiment of the present invention.

A third embodiment of the present invention will be described with reference to FIG. 10. In the present embodiment, the exposed area of inner lead 1*y* from resin mold portion 2 where LED 3 is mounted is set to the minimum area required for chip mounting of LED 3 and wire bonding, as shown in FIG. 10. By reducing the exposure of inner lead 1*y* and increasing the area covered with resin mold portion 2, the take-off efficiency of light emitted from LED 3 can be improved in the case where the mold resin is white resin having high reflectance to visible light. Furthermore, the bonding area between resin mold portion 2 and encapsulation resin 6 is increased, allowing improvement of the adherence therebetween. In the device of the third embodiment, chips of 1-wire light emitting diodes are applied as LED 3. The chip of a 1-wire light emitting diode has an electrode provided at the top and bottom of the light emitting diode chip. The electrode at the bottom side is coupled to the frame of inner lead 8 by means of silver paste or the like to obtain electrical junction. The electrode at the top side is wire bonded with gold wire 5 to obtain electrical junction with inner lead 9.

Fourth Embodiment

A fourth embodiment of the present invention will be described with reference to FIG. 11. The semiconductor light emitting device of the present embodiment shown in FIG. 11 corresponds to application to chips of 2-wire light emitting diodes as LED 3, as compared to the device of the third embodiment shown in FIG. 10 corresponding to chips of 1-wire light emitting diodes.

Figure 11:
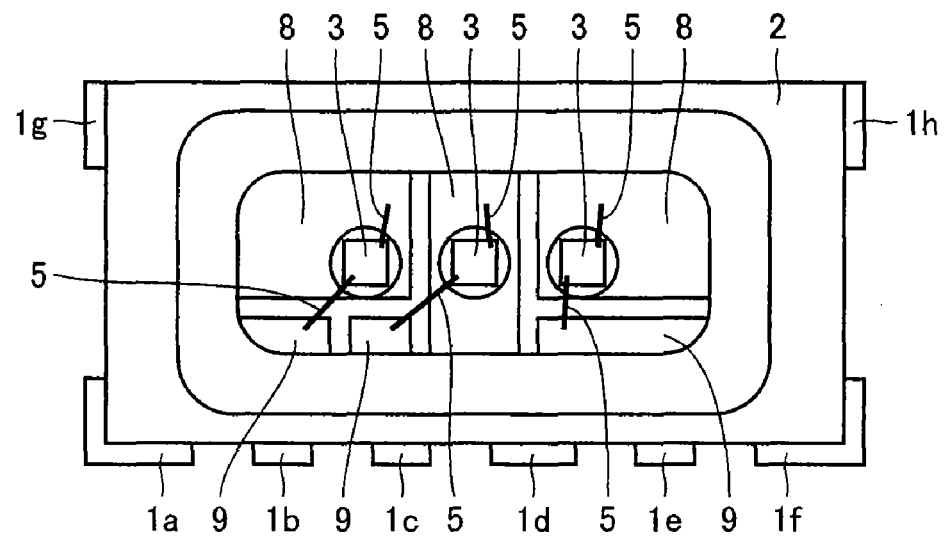
FIG. 11 is a front view of a semiconductor light emitting device according to a fourth embodiment of the present invention.
Figure 12:
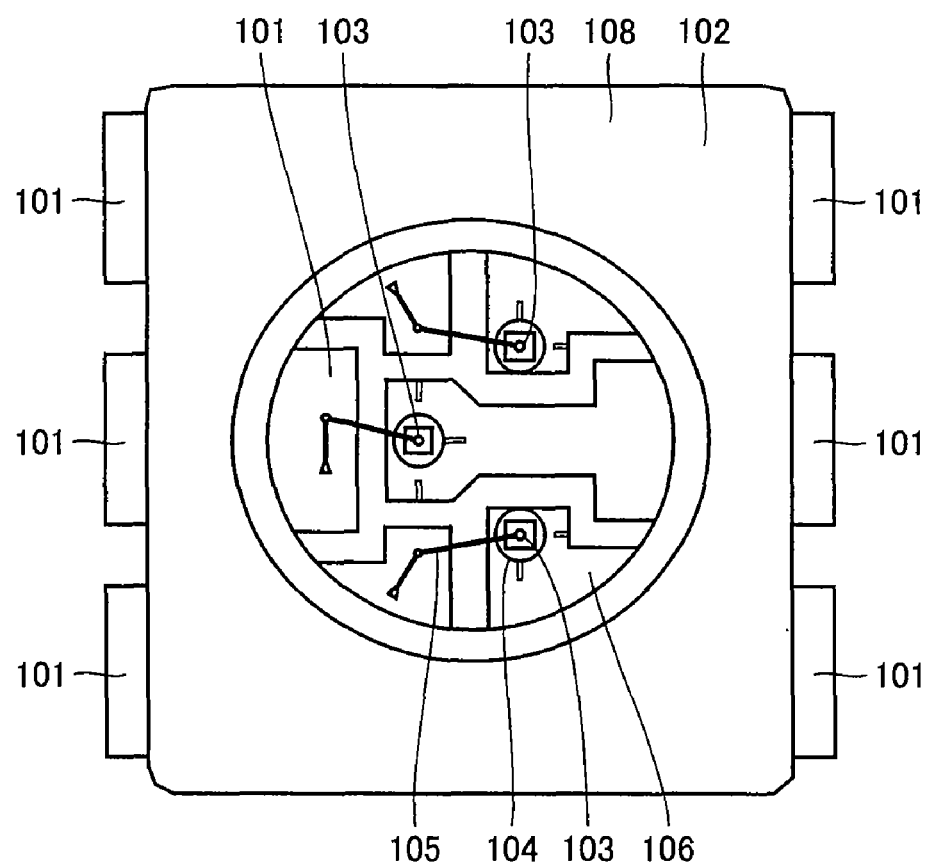
FIGS. 12, 13 and 14 are a front view, a bottom view, and a side view, respectively, of a conventional semiconductor light emitting device.
Figure 13:
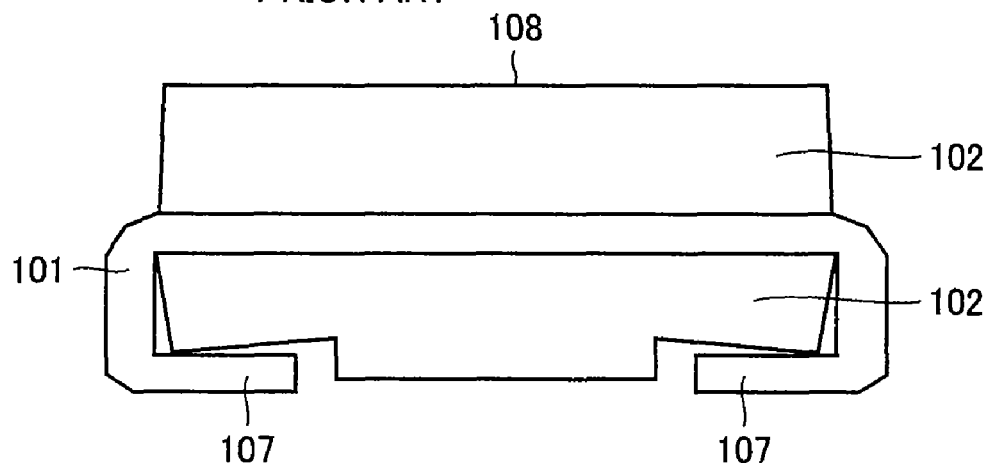
Figure 14:
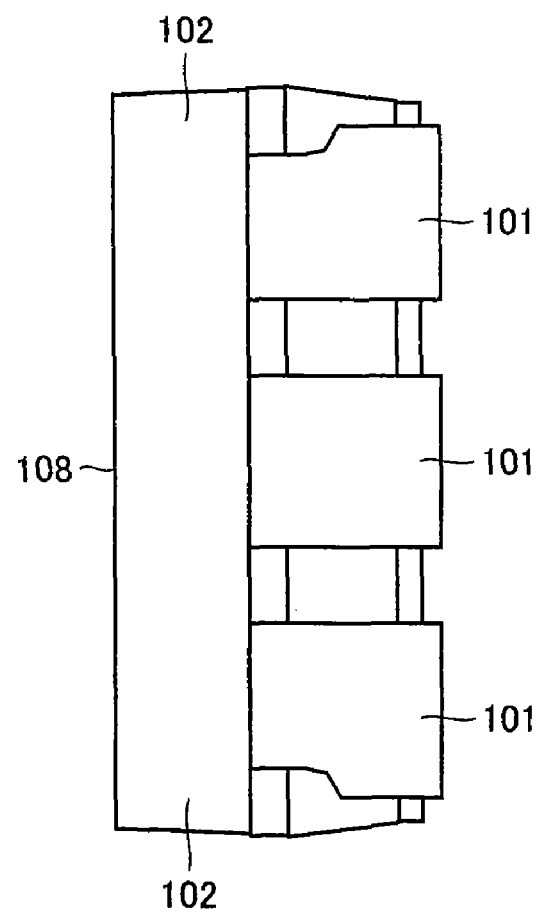

The 2-wire light emitting diode chip has two gold wires arranged in a configuration including the anode and cathode electrodes at the top of the LED chip, as shown in FIG. 11. The required connection is established exclusively at the top. The anode at the top of the LED chip and inner lead 8 for the anode are connected by gold wire 5. The cathode at the top of the LED chip and inner lead for the cathode are connected by gold wire 5.

According to the present embodiment, a semiconductor light emitting device having a frame layout configuration applicable to both a 1-wire chip shown in FIG. 10 or a 2-wire chip shown in FIG. 11 for establishing connection between the inner lead and LED 3 can be implemented.

According to each of the embodiments set forth above of the present invention, a mounting method directed to side emission and a mounting method directed to top emission can be carried out selectively using the same components for mounting a light emitting element on a circuit board and the like in the fabrication of a device that requires a light emitting element.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor light emitting device comprising:
   a semiconductor light emitting element,
   a lead frame including a plurality of inner leads having a placement face where said semiconductor light emitting element is mounted and an extraction electrode, and a plurality of outer leads for electrodes, and
   a mold resin portion to fasten said lead frame,
   each of said outer leads disposed along a first outer wall face of the mold resin portion perpendicular to a light-emitting plane of said semiconductor light emitting element, and along a second outer wall face of the mold resin portion parallel to and opposite to said light-emitting plane,
   each of said first and second outer wall faces of said mold resin portion constituting a mount face and including at least one outer lead for each of an anode and a cathode electrically connected to an anode electrode and a cathode electrode of a semiconductor light emitting element,
   the at least one outer lead for an anode associated with each of said first and second outer wall faces extending inwardly from a common end edge of said first and second outer wall faces, and the at least one outer lead for a cathode associated with each of said first and second outer wall faces extending inwardly from an end edge opposite to said common end edge.

2. The semiconductor light emitting device according to claim 1, wherein said outer lead is disposed over said first and second outer wall faces of said mold resin portion, and all pairs of an anode terminal and a cathode terminal electrically connected to the anode and cathode of each semiconductor light emitting element are arranged at each of said first and second outer wall faces.

3. The semiconductor light emitting device according to claim 1, wherein a surface of said outer lead is parallel and flat on a face of the wall of the mold resin portion.

4. The semiconductor light emitting device according to claim 1, wherein said outer lead includes 8 terminals, among which four terminals are disposed for shared usage at said first and second outer wall faces of said mold resin portion, and one pair of two terminals among the remaining four terminals is disposed at said first outer wall face and the other pair of two terminals among the remaining four terminals is disposed at said second outer wall face.

5. The semiconductor light emitting device according to claim 1, wherein a common lead is split into two terminals in said lead frame, one terminal formed for a side-emission terminal and the other terminal formed for a top-emission terminal.

6. The semiconductor light emitting device according to claim 1, wherein a plurality of said semiconductor light emitting elements are mounted, an anode and cathode of each of the plurality of said semiconductor light emitting elements including an outer lead terminal, allowing independent driving and independent current adjustment of said plurality of said semiconductor light emitting elements.

7. The semiconductor light emitting device according to claim 1, wherein said semiconductor light emitting element is formed of a chip of one of the three primary colors, allowing current adjustment of each chip.

8. The semiconductor light emitting device according to claim 1, wherein said outer lead corresponds to a body of poor solder wettability plated with metal of favorable solder wettability.

9. The semiconductor light emitting device according to claim 8, wherein said outer lead corresponds to a body formed of Cu plated with Sn, Au or Ag.

10. The semiconductor light emitting device according to claim 1, wherein said semiconductor light emitting element is sealed with transparent resin.

11. The semiconductor light emitting device according to claim 10, wherein said transparent resin includes one of epoxy resin and silicone resin.

12. The semiconductor light emitting device according to claim 10, wherein said transparent resin includes opalescent resin added with a diffusing agent.

13. The semiconductor light emitting device according to claim 1, wherein said mold resin portion employs ceramics instead of resin molding.

14. The semiconductor light emitting device according to claim 1, wherein an outer lead of the lead frame where said semiconductor light emitting element is mounted has an area larger than the area of the outer lead where a semiconductor light emitting element is not mounted.

15. The semiconductor light emitting device according to claim 1, wherein said semiconductor light emitting element can be mounted to any of a 1-wire type chip and 2-wire type chip.

16. The semiconductor light emitting device according to claim 1, wherein said mold resin portion fastening said lead frame covers a portion of a surface of the inner lead at an opening plane at the light-emitting plane side.

17. The semiconductor light emitting device according to claim 1, wherein said mold resin portion fastening said lead frame does not cover a surface of the inner lead at an opening plane at the light-emitting plane side.

* * * * *